United States Patent
Wells

(10) Patent No.: US 7,355,222 B2
(45) Date of Patent: Apr. 8, 2008

(54) IMAGING DEVICE HAVING A PIXEL CELL WITH A TRANSPARENT CONDUCTIVE INTERCONNECT LINE AND THE METHOD OF MAKING THE PIXEL CELL

(75) Inventor: David Wells, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 363 days.

(21) Appl. No.: 11/132,179

(22) Filed: May 19, 2005

(65) Prior Publication Data
US 2006/0261342 A1 Nov. 23, 2006

(51) Int. Cl.
H01L 27/148 (2006.01)
H01L 29/768 (2006.01)

(52) U.S. Cl. ........... 257/222; 257/223; 257/233; 257/E27.133

(58) Field of Classification Search ........ 257/214–216, 257/222–223, 225, 232–233, 431–432, E27.132, 257/E27.133
See application file for complete search history.

(56) References Cited

U.S. PATENT DOCUMENTS

| | | | |
|---|---|---|---|
| 6,140,630 A | 10/2000 | Rhodes | |
| 6,204,524 B1 | 3/2001 | Rhodes | |
| 6,310,366 B1 | 10/2001 | Rhodes | |
| 6,326,652 B1 | 12/2001 | Rhodes | |
| 6,333,205 B1 | 12/2001 | Rhodes | |
| 6,376,868 B1 | 4/2002 | Rhodes | |
| 6,661,046 B2* | 12/2003 | Kim | 257/292 |
| 6,831,264 B2 | 12/2004 | Cazaux | |
| 6,833,601 B2* | 12/2004 | Murakami | 257/437 |
| 6,852,591 B2 | 2/2005 | Rhodes | |
| 2004/0197967 A1 | 10/2004 | Chen | |
| 2004/0222417 A1 | 11/2004 | Yang | |

FOREIGN PATENT DOCUMENTS

JP  2001 332711  11/2001

OTHER PUBLICATIONS

Pierre Magnan, "Detection of Visible Photons in CCD and CMOS: A Comparative View" Nuclear Instruments and Methods in Physics Research, France, 2003.
International Preliminary Report on Patentability issued by the International Bureau on Nov. 20, 2007.
Written Opinion issued by the International Bureau.

\* cited by examiner

Primary Examiner—Hoai v Pham
(74) Attorney, Agent, or Firm—Dickstein Shapiro LLP

(57) ABSTRACT

The invention relates to an imaging device having a pixel cell with a transparent conductive material interconnect line for focusing incident light onto a photosensor and providing an electrical connection to pixel circuitry, and the method of making the same.

22 Claims, 14 Drawing Sheets

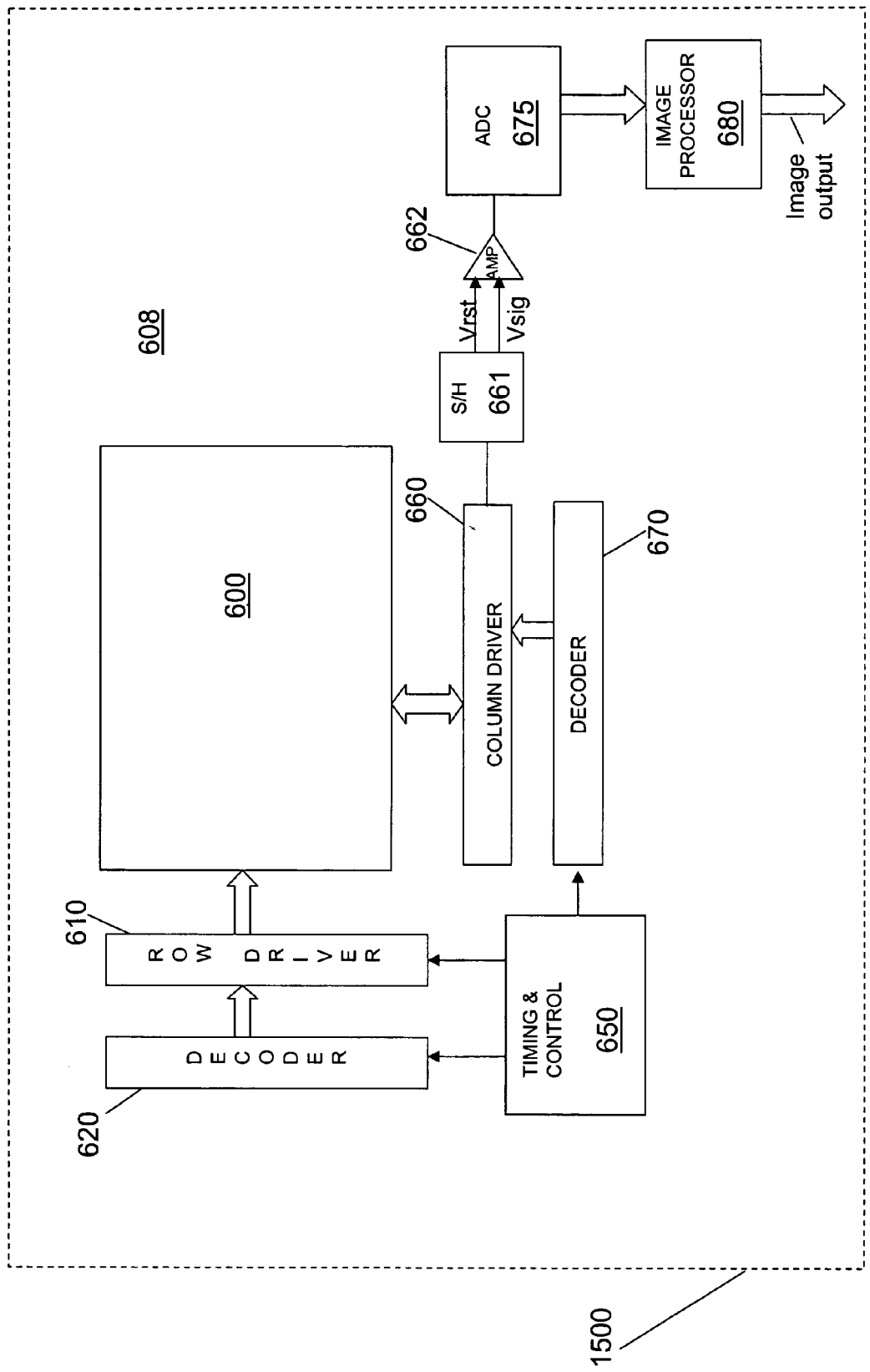

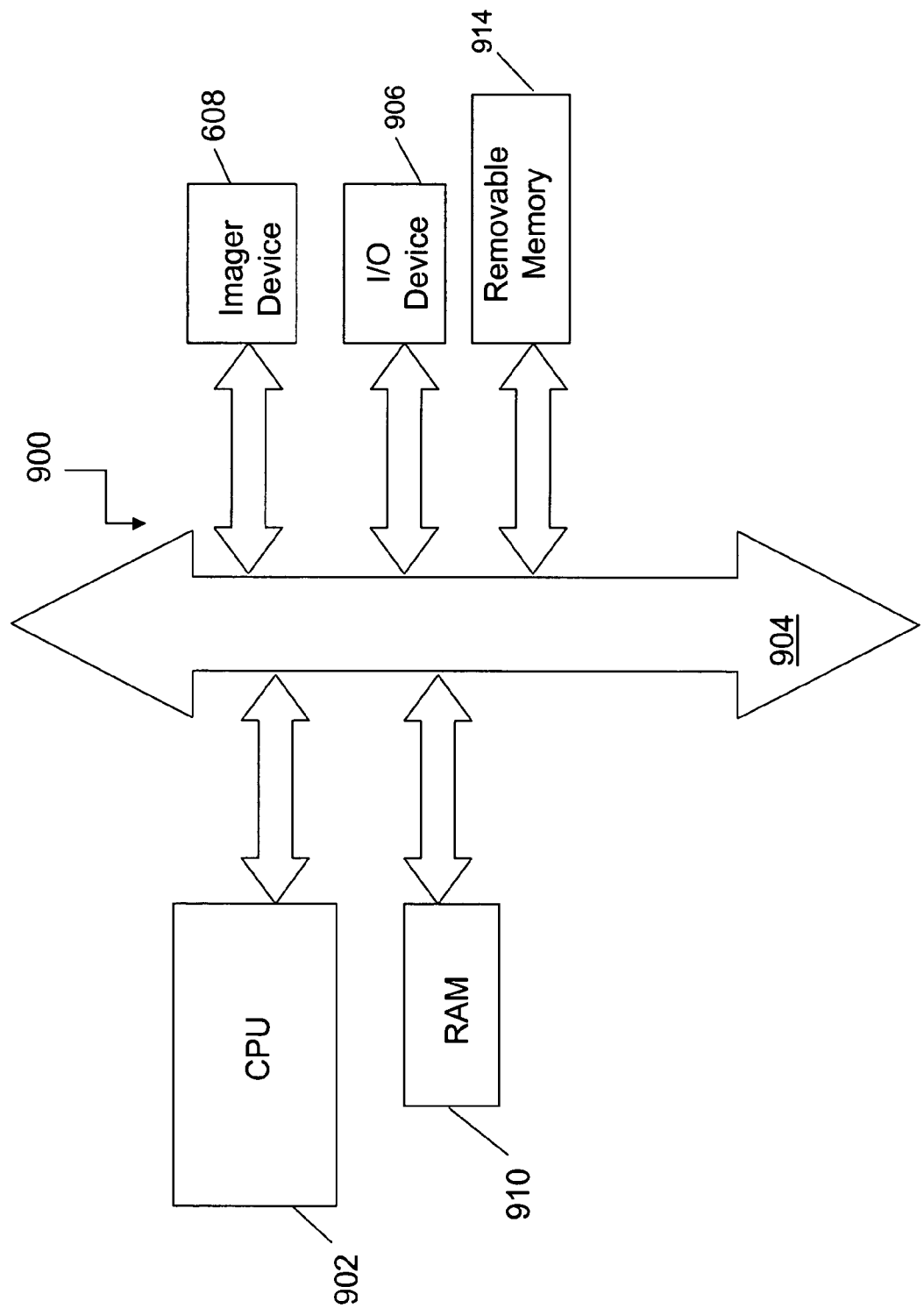

IMAGING DEVICE HAVING A PIXEL CELL WITH A TRANSPARENT CONDUCTIVE INTERCONNECT LINE AND THE METHOD OF MAKING THE PIXEL CELL

FIELD OF THE INVENTION

The invention relates to an imaging device having a pixel cell with a transparent conductive material interconnect line, and the method of making the same.

BACKGROUND OF THE INVENTION

Imaging devices, including charge coupled devices (CCD) and complementary metal oxide semiconductor (CMOS) sensors have commonly been used in photo-imaging applications. A CMOS imager circuit includes a focal plane array of pixel cells, each one of the cells including a photosensor, for example, a photogate, photoconductor or a photodiode for accumulating photo-generated charge in the specified portion of the substrate. Each pixel cell has a charge storage region, formed on or in the substrate, which is connected to the gate of an output transistor that is part of a readout circuit. The charge storage region may be constructed as a floating diffusion region. In some imager circuits, each pixel may include at least one electronic device such as a transistor for transferring charge from the photosensor to the storage region and one device, also typically a transistor, for resetting the storage region to a predetermined charge level prior to charge transference.

In a CMOS imager, the active elements of a pixel cell perform the functions of: (1) photon to charge conversion; (2) accumulation of image charge; (3) resetting the storage region to a known state; (4) transfer of charge to the storage region; (5) selection of a pixel for readout; and (6) output and amplification of a signal representing pixel charge. Photo charge may be amplified when it moves from the initial charge accumulation region to the storage region. The charge at the storage region is typically converted to a pixel output voltage by a source follower output transistor.

Exemplary CMOS imaging circuits, processing steps thereof, and detailed descriptions of the functions of various CMOS elements of an imaging circuit are described, for example, in U.S. Pat. No. 6,140,630; U.S. Pat. No. 6,376,868; U.S. Pat. No. 6,310,366; U.S. Pat. No. 6,326,652; U.S. Pat. No. 6,204,524; U.S. Pat. No. 6,333,205; and U.S. Pat. No. 6,852,591, all of which are assigned to Micron Technology, Inc. The disclosures of each of the forgoing are hereby incorporated by reference in their entirety.

A conventional imaging device 50, such as a CMOS imager, is illustrated in FIG. 1. The imaging device 50 has a conventional microlens 11 formed over a four transistor (4T) pixel cell 10. Light from a subject being imaged is incident as photons 1000 and passes through the conventional microlens 11, which is typically formed over a color filter 172. Each color filter allows predominantly light of a respective specific color to pass through to the photosensor 12 of the pixel cell 10. A color is defined to be light having a specific range of wavelengths. Typical color filters include red, green, and blue filters (RGB), or cyan, magenta, and yellow (CMY) filters.

The photosensor 12 has a p-type region 12a and an n-type region 12b in a p-type epitaxial layer 14, which may be formed over a p-type substrate. The pixel cell 10 includes the photosensor 12, which may be implemented as a pinned photodiode, transfer transistor gate 16, floating diffusion region 18, reset transistor gate 22, source follower transistor gate 24 with associated source/drain regions, and row select transistor gate 26 with associated source/drain regions. The photosensor 12 is electrically connected to the floating diffusion region 18 by the transfer transistor gate 16 when the transfer transistor gate 16 is activated by a transfer gate control signal TX.

The reset transistor gate 22 is connected between the floating diffusion region 18 and a pixel supply voltage (e.g., Vaa-Vpix) line 31. A reset control signal RST is used to activate the reset transistor gate 22, which resets the floating diffusion region 18 to the pixel supply voltage Vaa-Vpix level as is known in the art. The source follower transistor gate 24 is connected to the floating diffusion region 18 by a charge transfer line 23, and is connected between the array supply voltage line 31 and the row select transistor gate 26. The source follower transistor gate 24 responds to the charge stored at the floating diffusion region 18 to produce an electrical output voltage signal. The row select transistor gate 26 is controllable by a row select signal SEL for selectively connecting the source follower transistor gate 24 and its output voltage signal to a column line 28 of a pixel array.

Although the imaging device 50 of FIG. 1 works well, the size of the overall imaging device 50 is limited by the multitude of layers that are involved in the process of reading the photon-generated charge out of the pixel cell. As but one example, FIG. 1 includes a metallization layer M1 that may include the charge transfer line 23, which electrically couples the floating diffusion region 18 to the source follower transistor gate 24.

In addition, imaging device 50 also includes an additional metallization layer M2 that may include the column and voltage lines 28, 31. It should be noted that the specific conductors arranged in the M1 and M2 layer of a solid state imager may differ from those shown in FIG. 1, but typically at least two metallization layers M1, M2 are present. In more complex designs a third metallization layer M3 may also be employed above the M2 layer.

Because the plurality of interconnect lines in the M1 and M2 material layers (and M3 layer if employed) are fabricated from opaque, metal materials, the interconnect lines must be placed in positions in the array of pixels that do not interfere with the photons 1000 striking the photosensor 12. This requires a routing of the interconnect lines such that they do not cross the photosensors 12.

Additionally, the photons 1000 entering the imaging device 50 can reflect off of the opaque metal materials in M1 and M2 layers reducing the overall image capture by the photosensor 12, resulting in a poorer image quality. This too must be considered when routing conductors in the M1 and M2 layers.

Accordingly, an imager that facilitates conductive wiring without interfering with the light path to the photosensor 12 is desirable.

BRIEF SUMMARY OF THE INVENTION

The invention in various exemplary embodiments, provides an imaging device employing light transmissive conductors for making electrical connections and which may also be configured and arranged to serve as a light transmissive portion of the imaging device. In some embodiments the transparent conductive material is configured and arranged to act as a microlens, while in others it is configured and arranged to act as a color filter.

BRIEF DESCRIPTION OF THE DRAWINGS

The above-described features and advantages of the invention will be more clearly understood from the following detailed description, which is provided with reference to the accompanying drawings in which:

FIG. 13 illustrates a block diagram of a CMOS imager incorporating an imaging device constructed in accordance with FIG. 2; and FIG. 14 illustrates a schematic diagram of a processor system incorporating the CMOS imager of FIG. 12 in accordance with an exemplary embodiment of the invention.

DETAILED DESCRIPTION OF THE INVENTION

As used herein, the terms "semiconductor substrate" and "substrate" are to be understood to include any semiconductor-based structure. The semiconductor structure should be understood to include silicon, silicon-on-insulator (SOI), silicon-on-sapphire (SOS), silicon-germanium, doped and undoped semiconductors, epitaxial layers of silicon supported by a base semiconductor foundation, and other semiconductor structures. The semiconductor need not be silicon-based. The semiconductor could be germanium or gallium arsenide. When reference is made to the semiconductor substrate in the following description, previous process steps may have been utilized to form regions or junctions in or over the base semiconductor or foundation.

The term "pixel cell," as used herein, refers to a photo-element unit cell containing a photosensor and associated circuitry for converting photons to an electrical signal. For purposes of illustration, a single representative pixel and its manner of formation may be illustrated in the figures and description herein; however, typically fabrication of a plurality of like pixels proceeds simultaneously. Accordingly, the following detailed description is not to be taken in a limiting sense.

In the following description, the invention is described in relation to a CMOS imager for convenience; however, the invention has wider applicability to any photosensor of any imager cell, including pixels used in a charge coupled device (CCD) and other state imagers.

Figure 2:
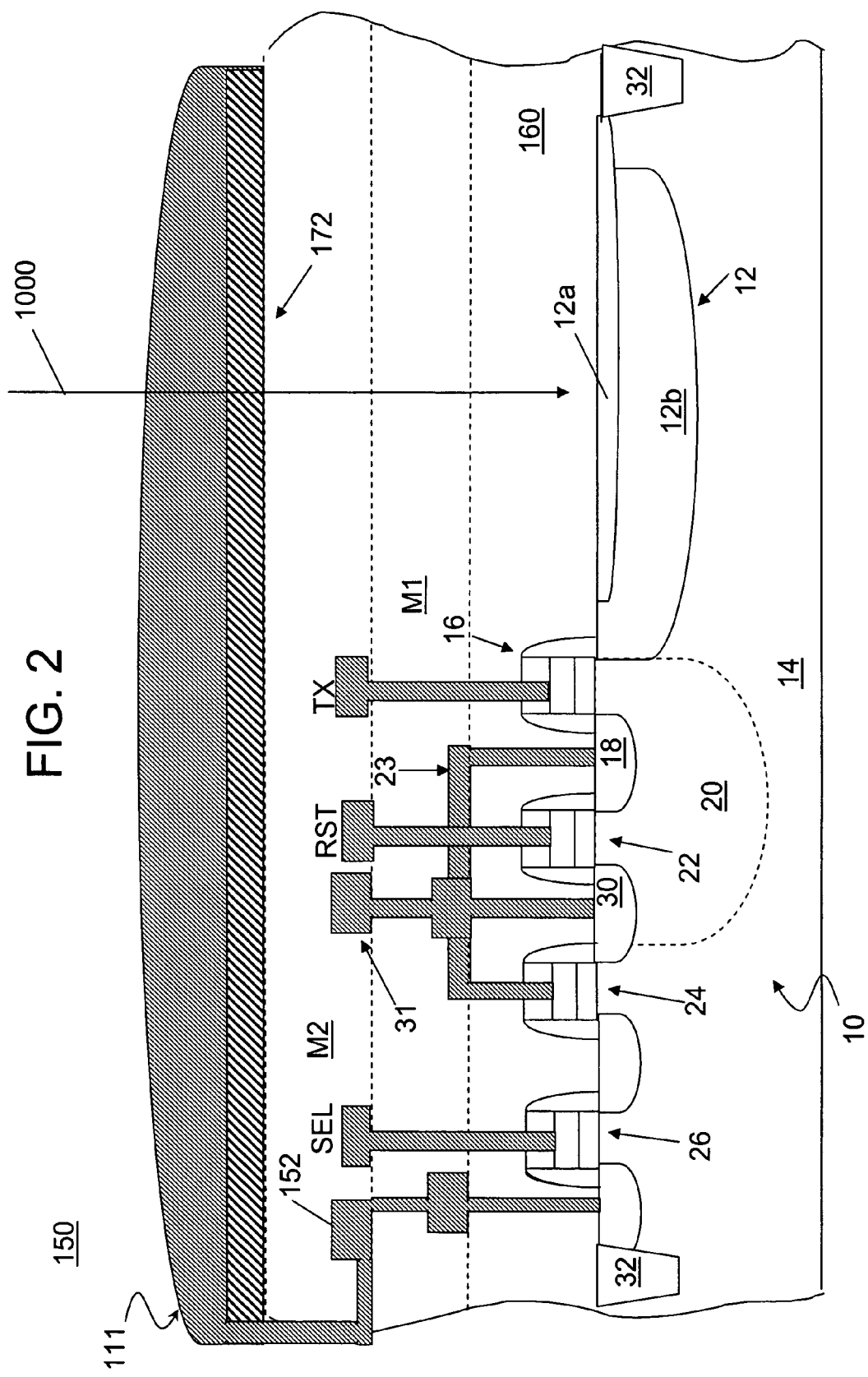
FIG. 2 illustrates a partial cross-sectional representation of a imaging device constructed in accordance with a first exemplary embodiment of the invention.

Referring to FIG. 2, a representational partial cross-sectional view of a CMOS imaging device 150 constructed in accordance with an exemplary embodiment of the invention is illustrated. The FIG. 2 imaging device 150 includes a pixel cell 10 having a photosensor 12 (implemented as a photodiode) that includes a p-type region 12a and an n-type region 12b in an epitaxial layer 14 provided over a p-type substrate, transfer transistor gate 16, floating diffusion region 18, reset transistor gate 22, source follower transistor gate 24 with associated source/drain regions, and row select transistor having gate 26 with associated source/drain regions. Significantly, the FIG. 2 imaging device 150 also includes a transparent column line 111 formed of a transparent conductive material electrically coupled by a conductor 152 (partially schematically illustrated) to the drain region 26a of the row select transistor gate 26. Transparent column line 111 is fabricated into a microlens for focusing incident light 1000 onto the photosensor 12. The transparent column line 111 is also coupled to column line pixel readout circuitry as known in the art.

The transparent column line 111 is formed of a transparent conductive material. The transparent conductive material could be formed of semiconducting oxides of a material selected from the group consisting of tin, indium, zinc, and cadmium. The transparent conductive material could thus be selected from the group consisting of $SnO_2$, $In_2O_3$, $Cd_2SnO_4$, $ZnO$, $Zn_2SnO_4$, $ZnSnO_3$, $Cd_2SnO_4$, $(Zn_2SnO_4)^4$, $(MgIn_2O_4)^5$, $(CdSb_2O_6: Y)^6$, $(ZnSnO_3)^7$, $(GaInO_3)^8$, $(Zn_2In_2O_5)^9$, and $(In_4Sn_3O_{12})^{10}$, and indium-tin oxide (ITO).

In operation, photons 1000 pass through the transparent column line 111 such that the photons 1000 are focused through a color filter 172 to strike the surface of the p-type region 12a of the photosensor 12 and generate electrons that are collected in the n-type region 12b of the photosensor 12. The charge is transferred through the transfer transistor gate 16 to the floating diffusion region 18, which is electrically coupled to the source follower transistor gate 24. The output signal from the source follower transistor gate 24 is gated to the transparent column line 111 by an associated row select transistor 26. When a row select signal from a conductor SEL is activated, the signal voltage produced by the source follower transistor 24 is gated to the transparent column line 111 where it is further processed by a sample/hold circuit coupled to transparent column line 111 and other signal processing circuits, discussed below with respect to FIG. 12.

Figure 1:
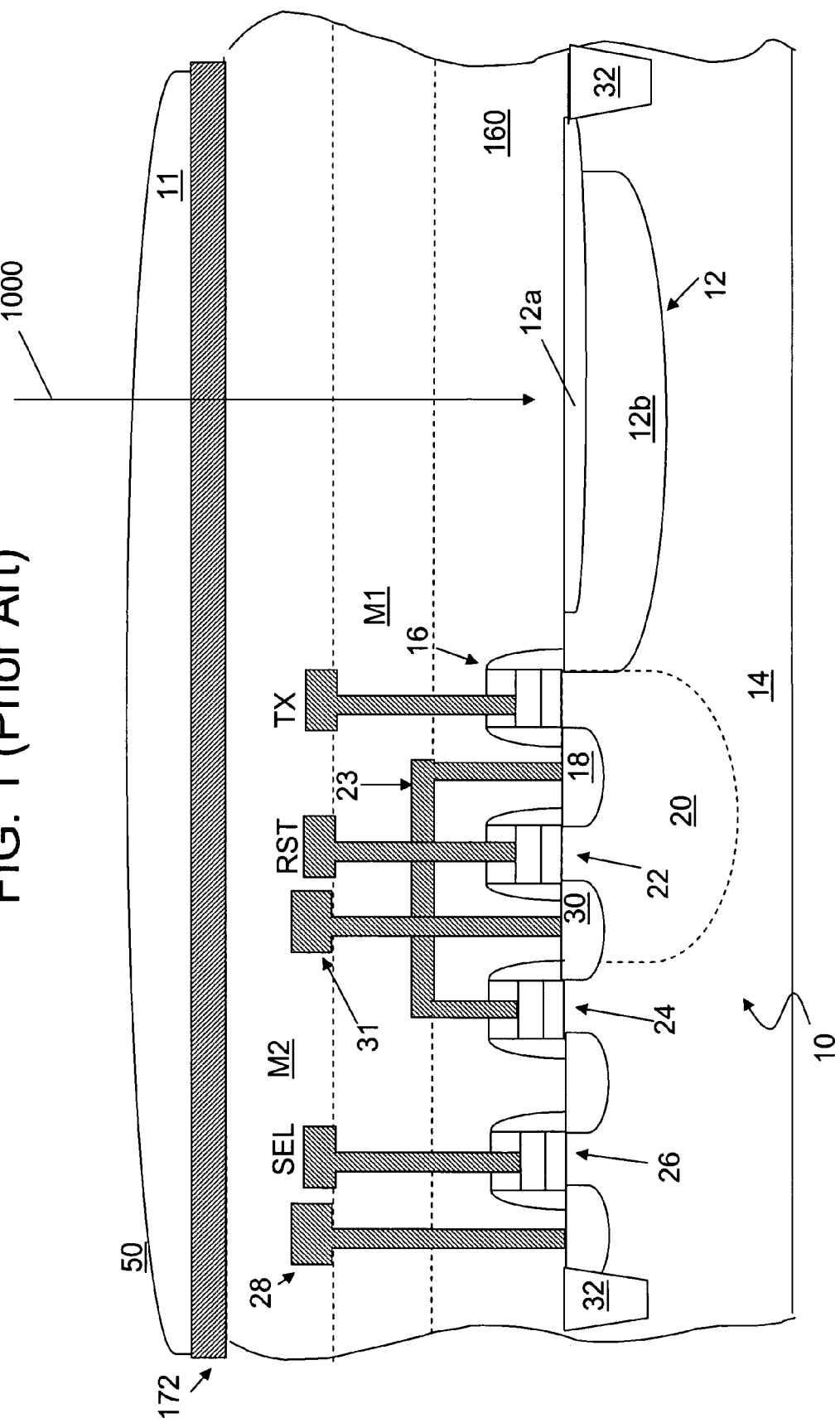
FIG. 1 illustrates a partial cross-sectional representation of a conventional imaging device.

The FIG. 2 imaging device 150 having a transparent column line 111 for focusing photons 1000 from incident light, and for conducting the signal processed by the source follower transistor 24 to readout circuitry simplifies the conductor routing in the M1 and M2 layers as the column lines (e.g., column line 28 (FIG. 1)) normally present in one or more of these layers as the transparent column line 111 is now moved to the top of the imager and serves the dual function of conductor and microlens. The transparent column line 111 serves a dual use of focusing incident light and conducting signal. This simplifies fabrication and lowers production costs.

In addition, the transparent conductive materials that can be used to form the transparent column line 111 are typically less expensive than the materials used for pixel cell microlenses (e.g., microlens 11 (FIG. 1)), resulting in further cost savings in production.

It should be noted that although the FIG. 2 imaging device 150 is illustrated as including a pixel cell 10 having a p-n-p photosensor configuration (i.e., a p-type region 12a formed in an n-type region 12b, which, in turn, is formed in a p-type epitaxial layer 14), it is not intended to be limiting in any way. For example, the pixel cell 10 could be formed having an n-p-n configuration in which the epitaxial layer 14 is an n-type substrate, and the photosensor 12 has an n-type region 12a formed within a p-type region 12b. Other photosensor structures such as a photogate, phototransistors, and photoconductors may also be used.

Although the transparent column line 111 is illustrated as having a semi-elliptical cross-sectional shape in FIG. 2, the illustration is not intended to be limiting in any way. For example, the transparent column line 111 could have a substantially rectangular, elliptical, or circular cross-sectional and/or top view shapes.

It should also be noted that although the transparent interconnect line is illustrated and described as a transparent column line 111, it could be any interconnect line that is typically used in pixel circuitry, e.g., it could be the Vaa-pix line, charge transfer line, reset control signal line, a row select line, or supply voltage line, and is not limited to the illustrated column line 111. The transparent conductive interconnect line must be capable of focusing light onto the photosensor 12 of the pixel cell 10, and provide for an electrical connection to pixel circuitry.

Figure 3:
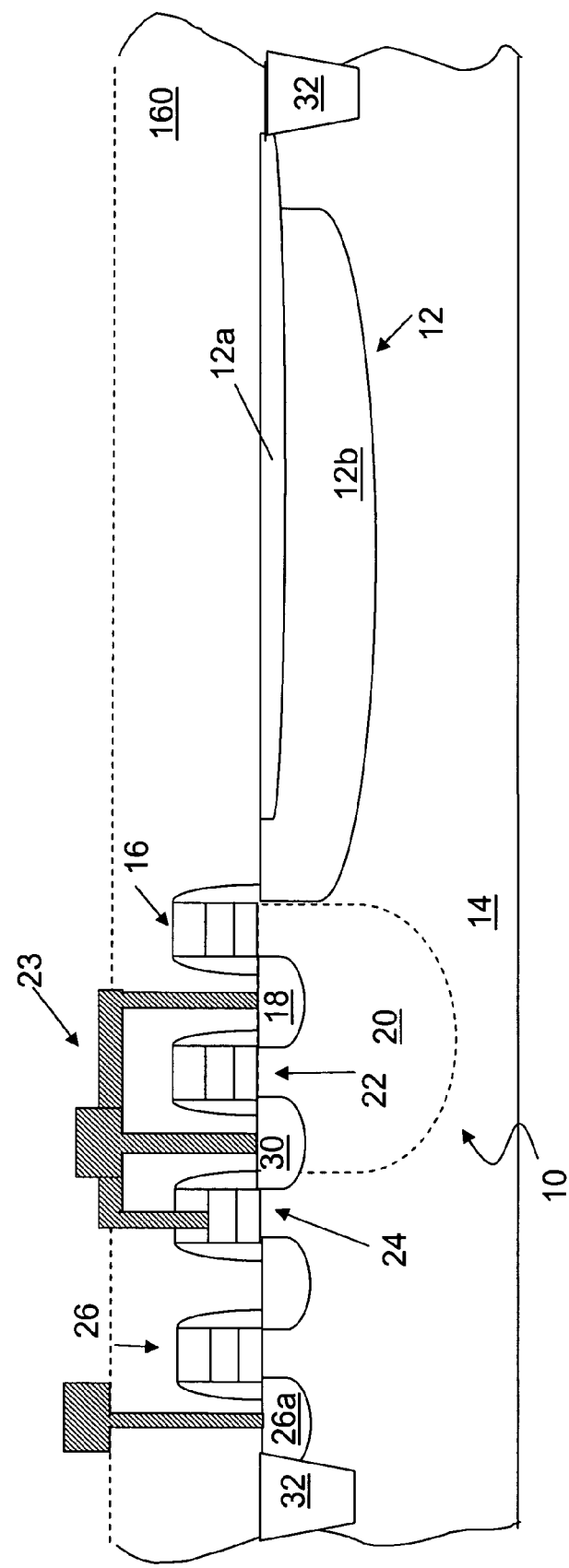
FIGS. 3-6 illustrate partial cross-sectional representations of different stages of the fabrication of the FIG. 2 imaging device.

FIGS. 3-6 illustrate an exemplary method of fabricating the FIG. 2 imaging device 150. As illustrated in FIG. 3, a planarization layer 160, e.g., a BPSG layer, is formed over the epitaxial layer 14 in and on which a photosensor 12, a transfer transistor gate 16, a floating diffusion region 18, a reset transistor gate 22, a source/drain region 30, a source follower transistor gate 24, and a row select transistor gate 26 have been formed. The planarization layer 160 can be formed of any material, including a material selected from the group consisting of silicon dioxide, borosilicate glass (BSG), phosphosilicate glass (PSG), and boro-phosphosilicate glass (BPSG). FIG. 3 also illustrates the charge transfer line 23 formed over the planarization layer 160, which connects the gate of the source follower transistor 24 to the floating diffusion region 18 through vias in layer 160. A patterned layer of conductors are also formed over the planarization layer 160, which allow for the electrical connection (through vias in layer 160) between the epitaxial layer 14 and the patterned layer of conductors formed over the planarized layer 160, which, in turn, provide an electrical connection to external circuitry, as discussed below with respect to FIG. 12.

Figure 4:
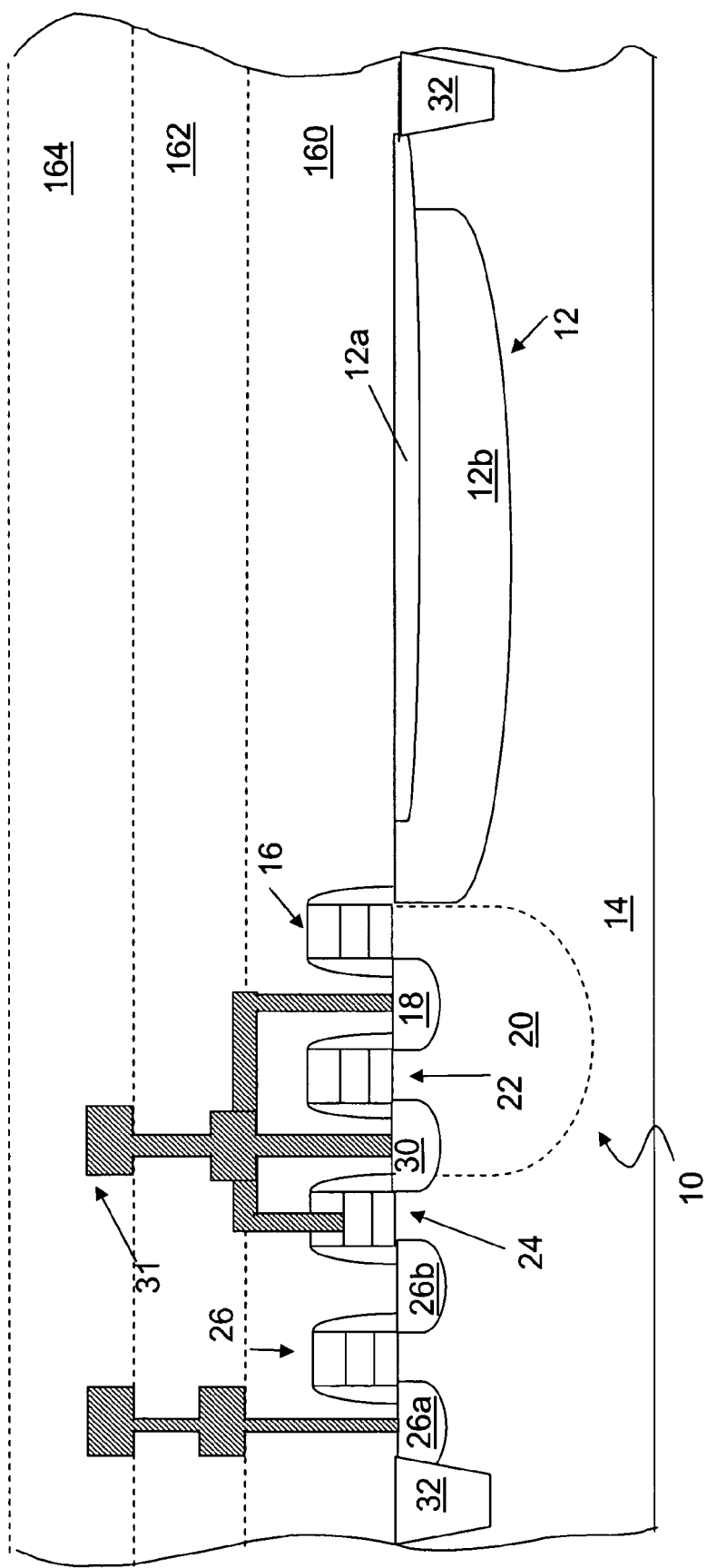

FIG. 4 illustrates first and second inter layer dielectric layers (ILD layers) 162, 164 formed over the planarization layer 160. The first and second ILD layers 162, 164 can be formed of any insulating material, such as, for example, silicon nitride. Before the second ILD layer 164 is formed, the first ILD layer 162 is typically CMP (chemical mechanical polishing) planarized and etched to provide vias. The vias are filled with a conductive material, and a second layer of patterned conductors are formed over the first ILD layer 162, which allow for the electrical connection between the epitaxial layer 14 structures and the conductors in the first ILD layer 162, which, in turn, provide an electrical connection to external circuitry, as discussed below with respect to FIG. 12.

Figure 5:
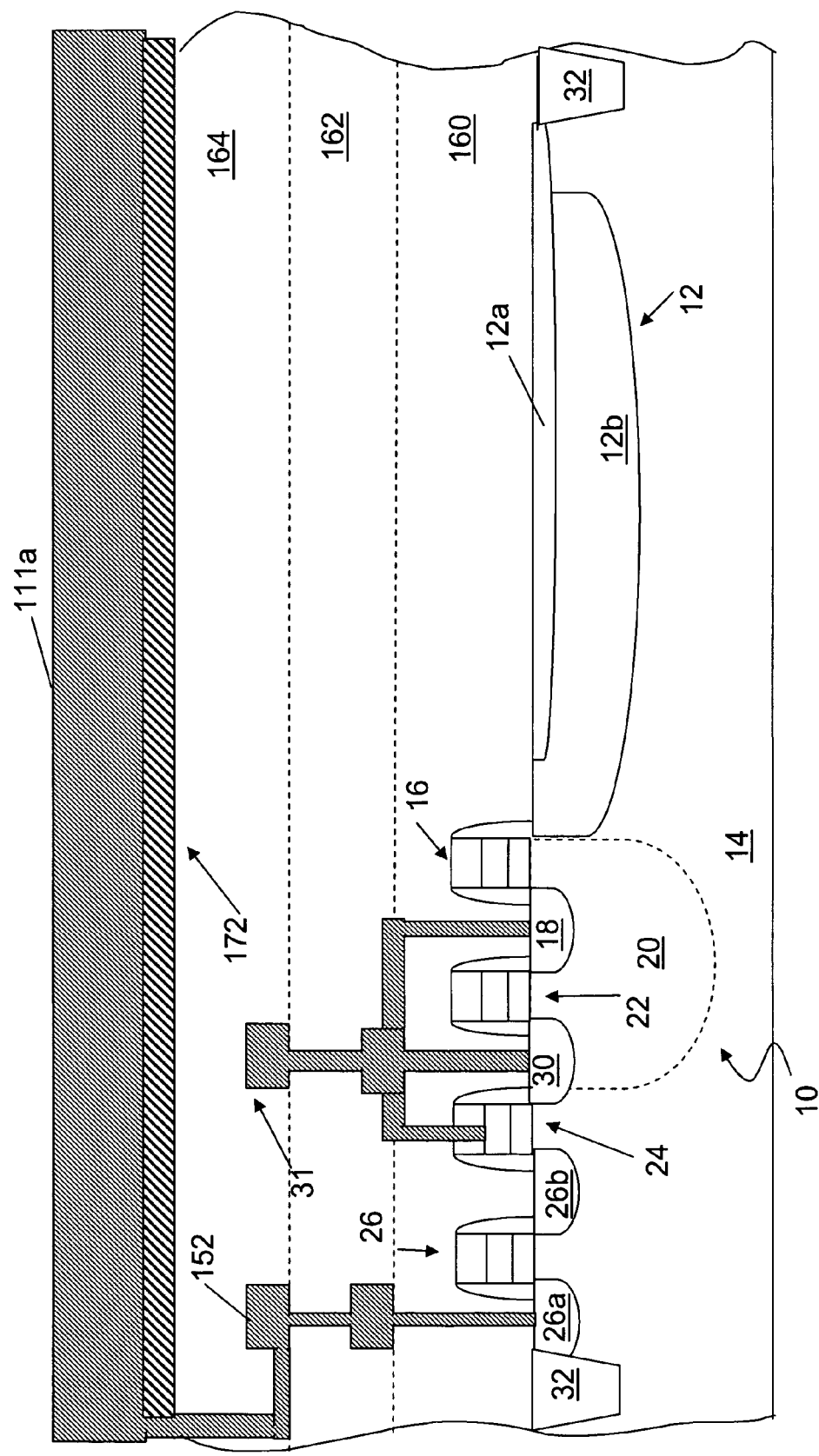

FIG. 5 illustrates the second ILD layer 164 formed over the first ILD layer 162, which is typically CMP planarized and etched to provide vias. The vias are filled with a conductive material, and a transparent column line precursor 111a is formed over the second ILD layer 164. It should be noted that the color filter 172 is typically formed before the transparent column line precursor 111a is deposited onto the imaging device.

It should be noted that the first and second ILD layers 162, 164 need not be formed of the same material. It should also be noted that the recesses to create vias within the planarization layer 160, first ILD layer 162, and the ILD material layer 164 can be formed by chemical etching, reactive ion etching (RIE), or other means of creating vias.

Figure 6:
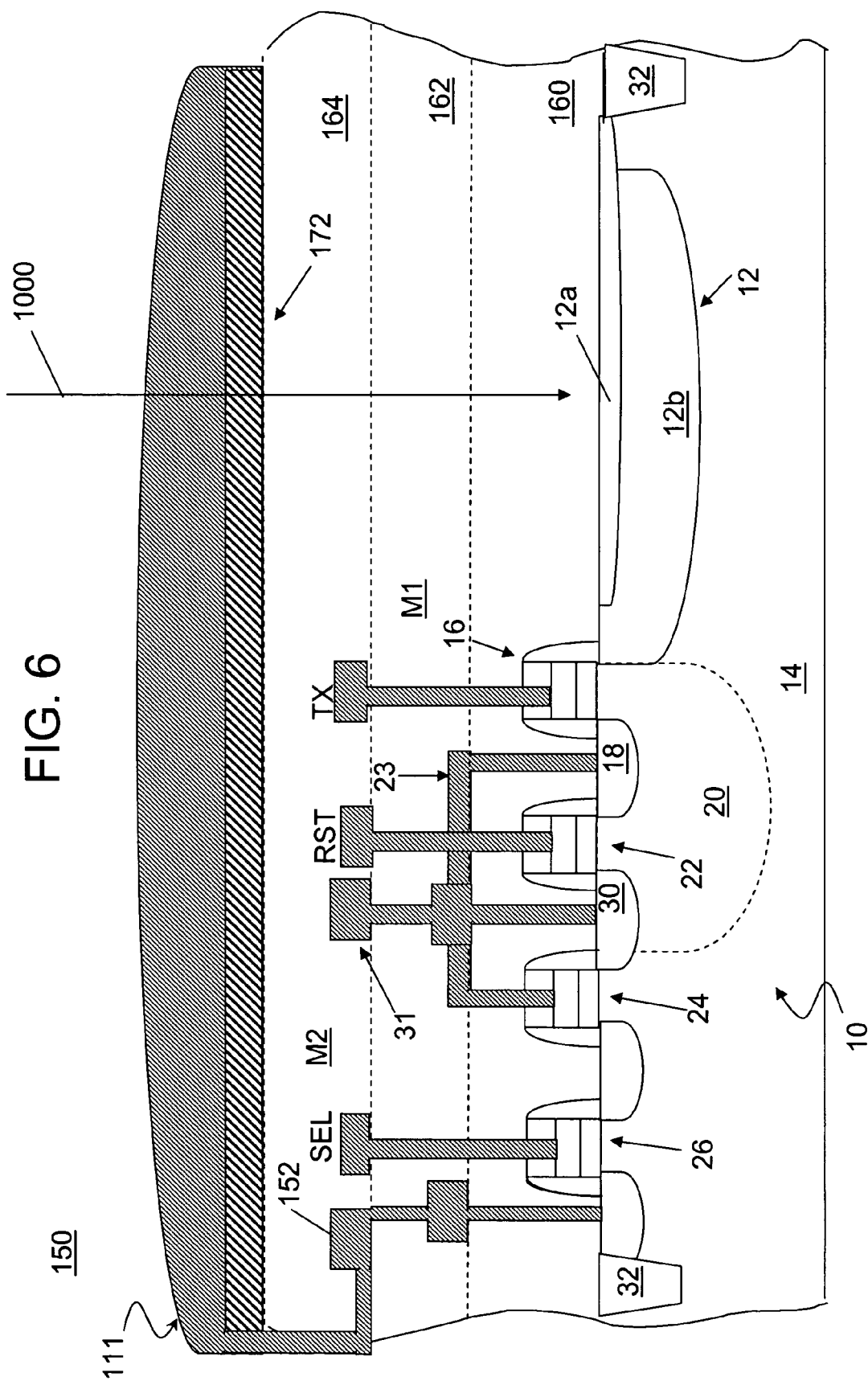

FIG. 6 illustrates the completed imaging device 150. The transparent column line precursor 111a (FIG. 5) is etched into patterns over the photosensor 12. The patterned transparent column line precursor 111a (FIG. 5) is then heated such that the patterned transparent column line precursor 111a melts and forms a hemi-elliptical shape based on the surface tension of the material used to form the transparent column line 111.

It should be noted that contact 152 and/or any of the other patterned conductors formed over the planarization layer 160 or the first and second ILD layers 162, 164 could be formed of transparent conductive material, and that these components may be formed of the same material comprising the transparent column line 111.

It should also be noted that the imaging device 150 could contain many more layers formed above or below the planarization layer 160 and the first and second ILD layers 162, 164, depending upon the application.

Figure 7:
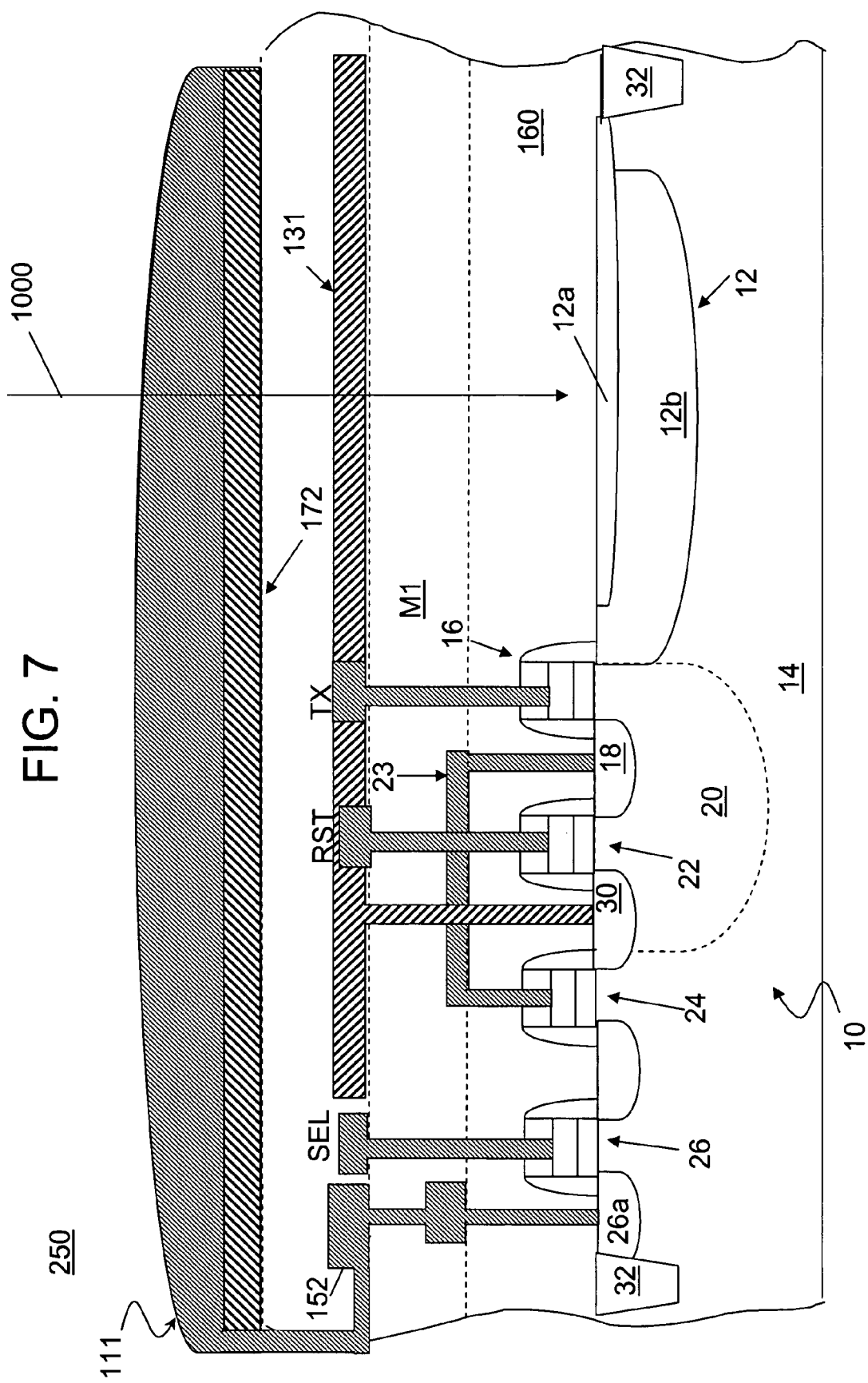
FIG. 7 illustrates a partial cross-sectional representation of a imaging device constructed in accordance with a second exemplary embodiment of the invention.

FIG. 7 illustrates an imaging device 250 constructed in accordance with a second exemplary embodiment of the invention. Like the FIG. 2 imaging device 150, the FIG. 7 imaging device 250 has a transparent column line 111 for focusing photons 1000 from incident light onto the photosensor 12 and conducting the pixel output signal charge from the drain region 26a of the row select transistor gate 26 to readout circuitry (not shown). The FIG. 7 imaging device 250 also has a voltage supply line 131 ($V_{aa\text{-}pix}$) formed of a transparent conductive material that may focus photons 1000 from incident light onto the photosensor 12. The voltage supply line 131 can be electrically coupled to the source/drain region 30. Since this conductor is transparent, it may cross the optical path to photosensor 12, thus simplifying conductor routing.

The signal lines for a pixel cell typically contained in the planarization layer 160 and/or first and second ILD layers 162, 164 (FIG. 6) include row reset gate signal lines, transfer gate signal lines and row select gate signal lines. Any of these signal lines may also be made of a transparent conductive material and routed in the planarization layer 160 and/or first and second ILD layers 162, 164 (FIG. 6) through a light path from the transparent column line 111 to the photosensor 12.

It should be noted that the voltage supply line 131 could be formed of the same transparent conductive material as the transparent column line 111, or a different transparent conductive material.

Figure 8:
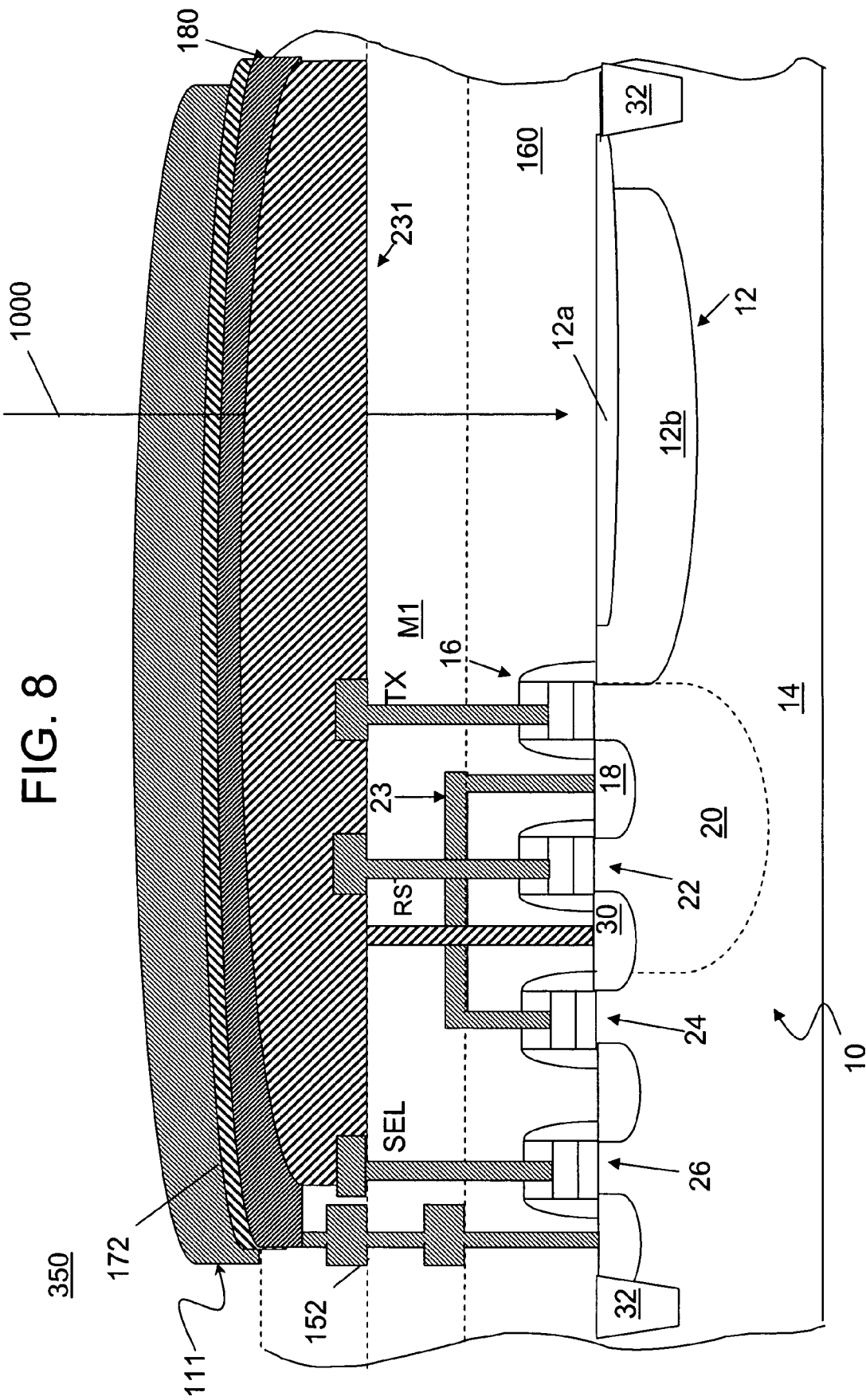
FIG. 8 illustrates a partial cross-sectional representation of a imaging device constructed in accordance with a third exemplary embodiment of the invention.

FIG. 8 illustrates an imaging device 350 constructed in accordance with a third embodiment of the invention in which a voltage supply line 231 formed of a transparent conductive material is formed to have a hemi-elliptical shape. As discussed above with respect to FIG. 6, the voltage supply line 231 can be patterned by conventional photolithography. The voltage supply line 231 is then treated with heat to form a hemi-elliptical shape. An insulator 180 can be formed on the voltage supply line 231, and take on the hemi-elliptical shape of the voltage supply line 231. The illustrated color filter 172 is formed over the insulator 180, which also takes on the hemi-elliptical shape of the insulator 180. The transparent column line 111, in turn, can be formed over the hemi-elliptical color filter 172, and take on the hemi-elliptical shape of the color filter 172. FIG. 8 also illustrates an insulator 180 over the voltage supply line 231 to electrically isolate the voltage supply line 231 with the transparent column line 111. The transparent column line 111 in this exemplary embodiment has a semi-elliptical shape. The color filter 172 is formed below the transparent column line 111. The shape of the voltage supply line 231 may increase the amount of photons 1000 that are focused on to the photosensor 12 of the pixel cell 10.

Figure 9:
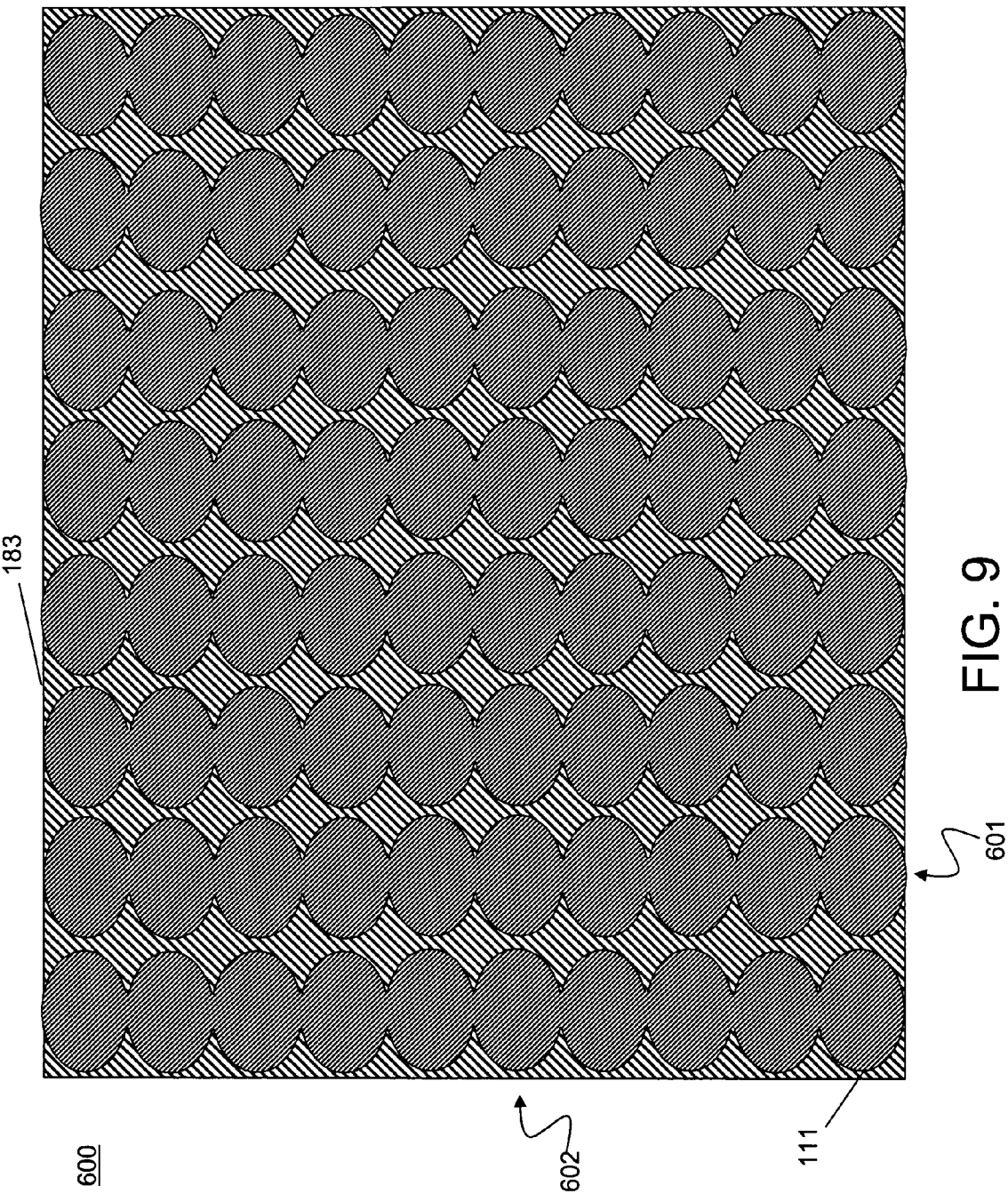
FIG. 9 illustrates a top-down representation of a plurality of FIG. 2 imaging devices.

FIG. 9 illustrates a top-down view of an imaging device array 600 fabricated in accordance with one of the embodiments of the invention. The illustrated imaging device array 600 contains at least one imaging device of the invention (e.g., 150, 250, 350 (of FIGS. 2, 7, or 8)). Imaging device array 600 comprises a plurality of imaging devices arranged in a predetermined number of columns 601 and rows 602. FIG. 9 illustrates the column lines 111 formed as a single line coupling the drain region of the row select transistor gate 26 (e.g., FIG. 2) of each pixel cell to external circuitry. As illustrated, the column lines 111 each have a semi-elliptical shape and are coextensive with one another, i.e., each column line in a particular column 601 are fabricated such that each column line 111 is joined with an adjacent column line 111 in the column. The illustrated image device array 600 also has an insulator 183 formed between each of the columns 601 to electrically isolate each column 601. In operation, each row of pixel cells in the image device array 600 can be read out in succession as discussed in further detail below with respect to FIG. 12.

Although the FIG. 9 imaging device array 600 is illustrated as a 10×8 imaging device array, it should be noted that an imaging device arrays typically contains millions of imaging devices (each having a pixel cell) arranged in multiple columns and rows. It should also be noted that the shape of the transparent column line 111 could be varied. For example, the transparent column lines 111 over the photosensors 12 (FIG. 2) of each imaging device 150 could be substantially rectangular over the photosensor. Each transparent column line 111 over the photosensors 12 (FIG. 12) could also be connected by a metal line or a transparent conductive material.

Figure 10:
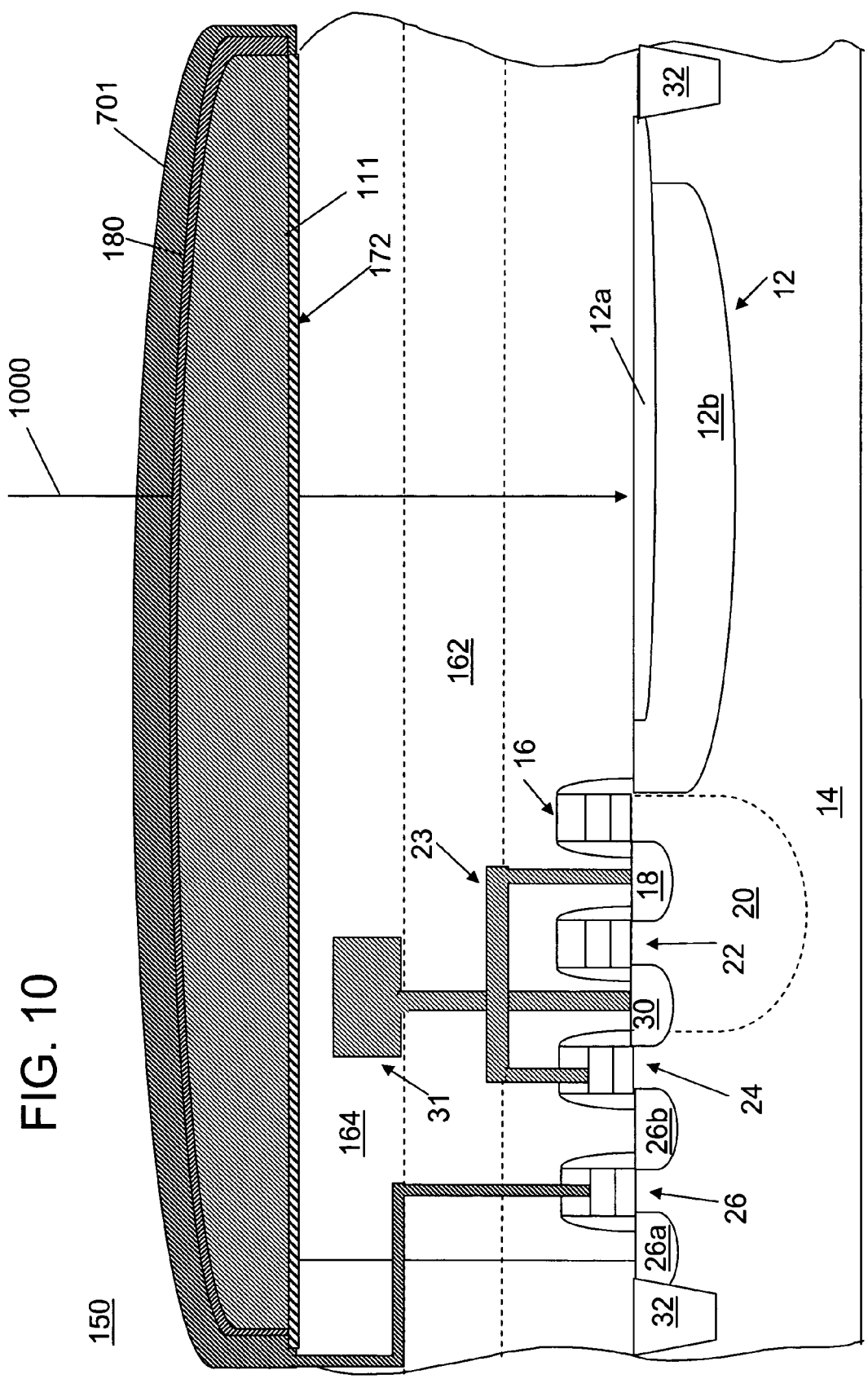
FIG. 10 illustrates a partial cross-sectional representation of an imaging device constructed in accordance with a fourth exemplary embodiment of the invention.

FIG. 10 illustrates a cross-sectional representation of the imaging device 150 used in the FIG. 9 imaging device array 600 fabricated with a row select line 701 formed over the transparent column line 111. The illustrated row select line 701 is formed of a transparent conductive material, as defined above. The row select line 701 may be formed over the column line 111 in a hemi-elliptical shape, as illustrated in FIG. 10. Alternatively, the row select line 701 may be formed over the column line 111, and then planarized to have a planar surface. The row select line 701 may further focus the incident light 1000 onto the photosensor 12 of the pixel cell 10. It should be noted that the row select line 701 could be formed of the same material as the transparent column line 111. The row select line 701 could also be formed of a material different than the transparent column line 111. An insulator 180 is typically provided between the transparent column line 111 and the row select line 701 to electrically isolate each conductor.

Figure 11:
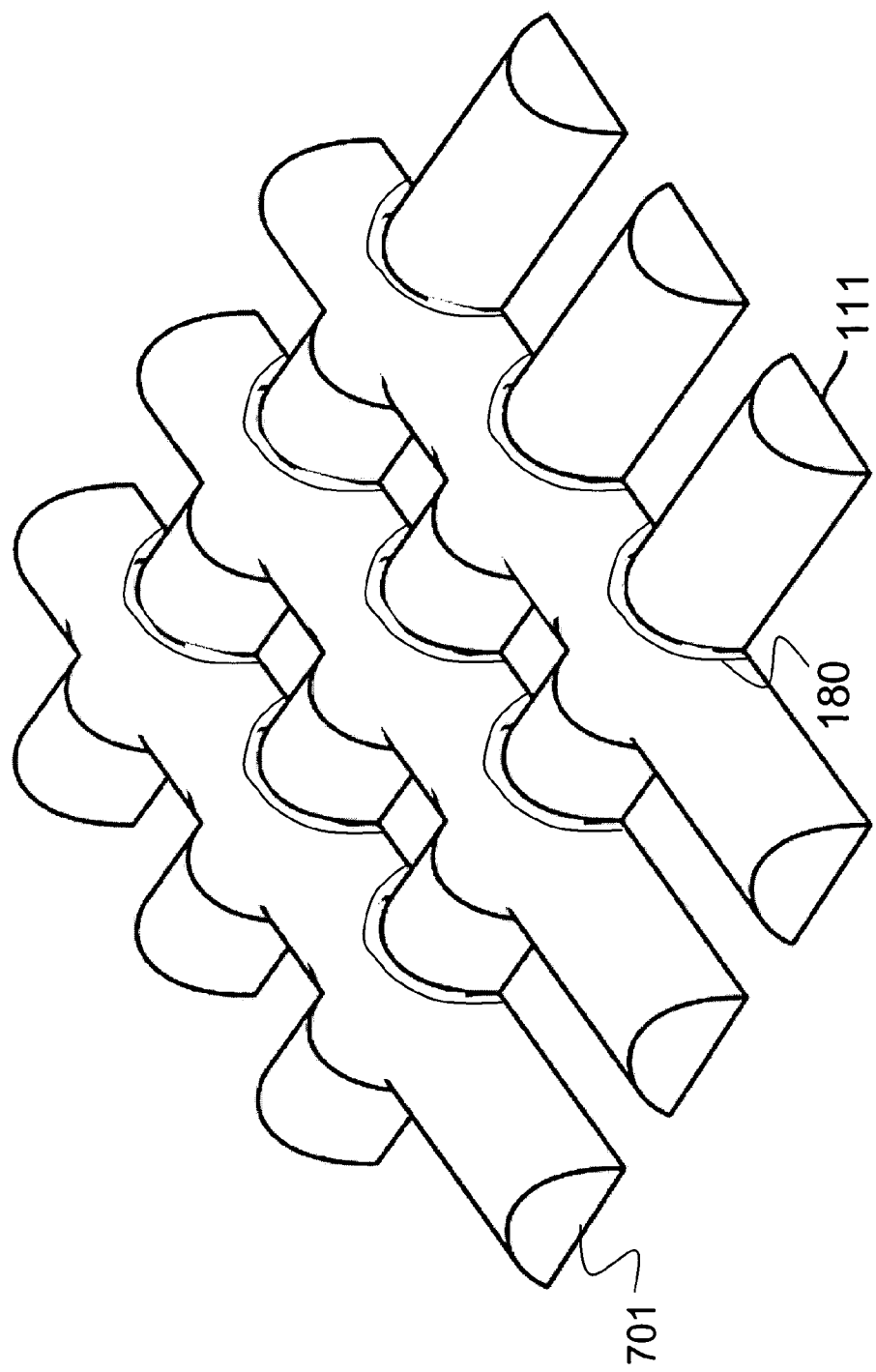
FIG. 11 illustrates a partial top-down view of a plurality of the FIG. 10 imaging device.

FIG. 11 illustrates a partial top-down view of a plurality of the FIG. 10 imaging device 150. The illustrated row select line 701 is formed over the hemi-elliptical transparent column line 111, and takes on the shape of the hemi-elliptical shape of the column line 111. The row select line 701 may further focus the incident light 1000 onto the photosensor 12 (FIG. 10) of the pixel cell 10 (FIG. 10). It should be noted that the insulator 180 is typically provided between the transparent column line 111 and the row select line 701 to electrically isolate each conductor.

Figure 12:
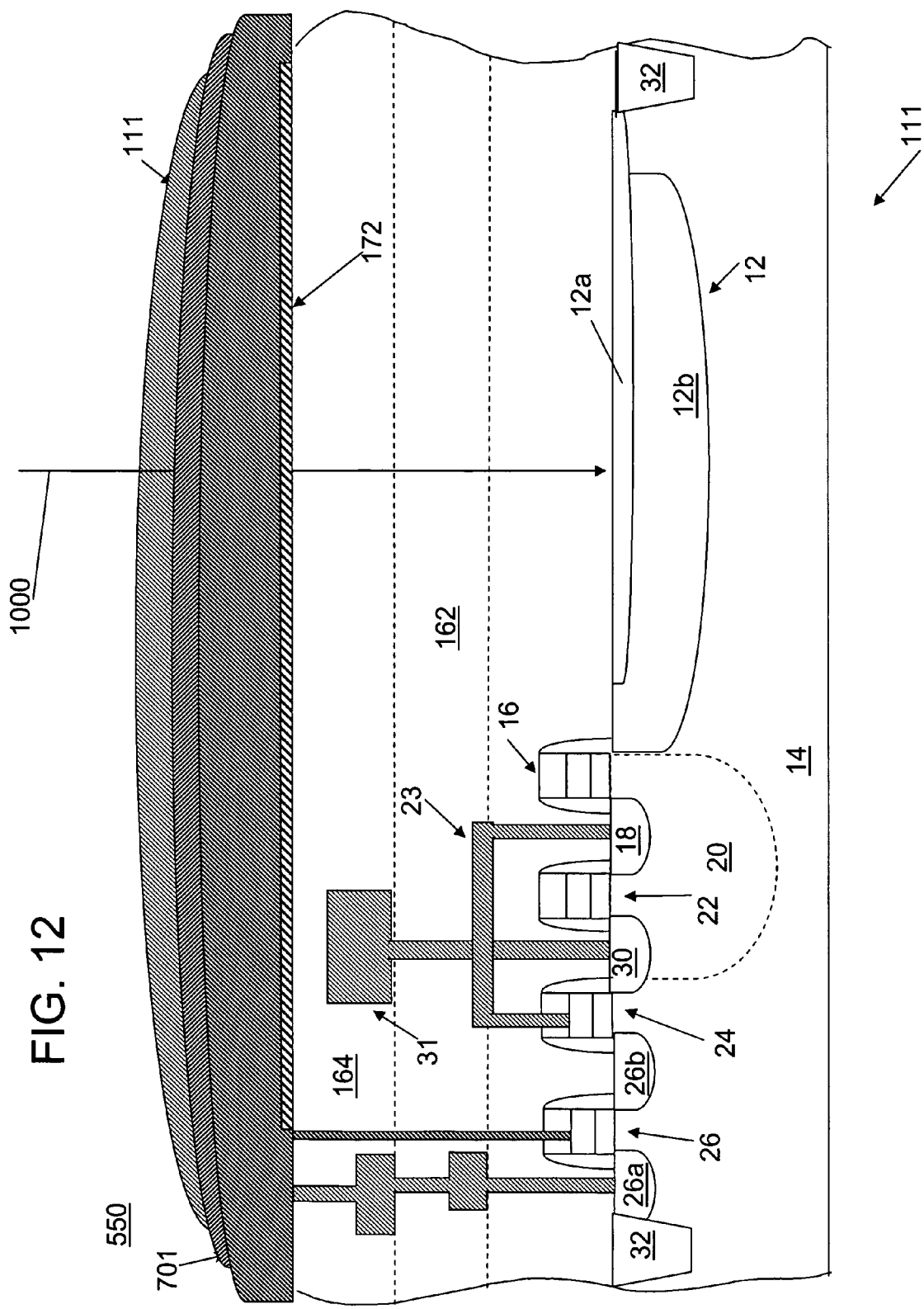
FIG. 12 illustrates a partial cross-sectional representation of an imaging device constructed in accordance with a fifth exemplary embodiment of the invention

FIG. 12 illustrates a cross-sectional representation of an imaging device 550 constructed in accordance with a fifth exemplary embodiment of the invention in which the row select line 701 is formed between the transparent column line 111 and the photosensor 12. Although the row select line 701 is illustrated as having an hemi-elliptical shape, the illustration is not intended to be limiting in any way. For example, the row select line 701 could have a substantially circular, semi-circular, or rectangular shape.

FIG. 13 illustrates a CMOS imager 608 incorporating a pixel array of the invention. Although the pixel array may be formed with any one of the exemplary embodiments of FIGS. 2, 8, 9, 10, or 12, FIG. 13 illustrates the FIG. 9 imaging device array 600. The pixel cells 10 (FIG. 2) of each imaging device 150 (FIG. 9) of each row in imaging device array 600 are all turned on at the same time by a row select line, and the pixel cells of each column are selectively output by respective transparent column line 111 (FIG. 9). A plurality of row and column lines (transparent column lines 111 (FIG. 9)) are provided for the entire imaging device array 600. The row lines are selectively activated in sequence by the row driver 610 in response to row address decoder 620 and the transparent column lines 111 (FIG. 9) are selectively activated in sequence for each row activation by the column driver 660 in response to column address decoder 670. Thus, a row and column address is provided for each pixel 10 of the imaging device 150 (FIG. 9). The CMOS imager is operated by the control circuit 650, which controls address decoders 620, 670 for selecting the appropriate row and column lines for pixel readout, and row and column driver circuitry 610, 660 which apply driving voltage to the drive transistors of the selected row and column lines.

The pixel output signals typically include a pixel reset signal, $V_{rst}$ taken off of the floating diffusion region (via the source follower transistor)when it is reset and a pixel image signal, $V_{sig}$, which is taken off the floating diffusion region (via the source follower transistor) after charges generated by an image are transferred to it. The $V_{rst}$ and $V_{sig}$ signals are read by a sample and hold circuit 661 and are subtracted by a differential amplifier 662, which produces a difference signal ($V_{rst}$–$V_{sig}$) for each pixel cell 10, which represents the amount of light impinging on the pixels. This signal difference is digitized by an analog to digital converter 675. The digitized pixel signals are then fed to an image processor 680 to form and output a digital image. In addition, as depicted in FIG. 13, the CMOS imager device 608 may be included on a semiconductor chip (e.g., wafer 1500).

FIG. 14 shows a typical processor system 900 that includes an imaging device 608 (such as the imaging device 608 illustrated in FIG. 13) of the invention. The processor system 900 is exemplary of a system having digital circuits that could include image sensor devices. Without being limiting, such a system could include a computer system, camera system, scanner, machine vision, vehicle navigation, video phone, surveillance system, auto focus system, star tracker system, motion detection system, image stabilization system, and other systems employing an imager.

System 900, for example a camera system, comprises a central processing unit (CPU) 902, such as a microprocessor, that communicates with an input/output (I/O) device 906 over a bus 904. Imaging device 608 also communicates with the CPU 902 over the bus 904. The processor-based system 900 also includes random access memory (RAM) 910, and can include removable memory 914, such as flash memory, which also communicate with the CPU 902 over the bus 904. The imaging device 608 may be combined with a processor, such as a CPU, digital signal processor, or microprocessor, with or without memory storage on a single integrated circuit or on a different chip than the processor.

It should again be noted that although the invention has been described with specific references to CMOS imaging devices (e.g., 150, 250, 350, 550, of FIGS. 2, 8, 9, 10, and 12), the invention has broader applicability and may be used in any imaging apparatus. For example, the invention may be used in conjunction with charge coupled device (CCD) imagers. The above description and drawings illustrate preferred embodiments which achieve the objects, features, and advantages of the invention. Although certain advantages and preferred embodiments have been described above, those skilled in the art will recognize that substitutions, additions, deletions, modifications and/or other changes may be made without departing from the spirit or scope of the invention. Accordingly, the invention is not limited by the foregoing description but is only limited by the scope of the appended claims.

What is claimed as new and desired to be protected by Letters Patent of the United States is:

1. A pixel cell comprising:
    a photosensor having a charge accumulation area;
    pixel circuitry coupled to said photosensor for operating said pixel cell to produce at least one pixel output signal; and
    a transparent conductive material interconnect line for focusing incident light onto said photosensor and providing an electrical connection to said circuitry.

2. The pixel cell of claim 1, wherein said transparent conductive material is a semiconducting oxide of a material selected from the group consisting of tin, indium, zinc, and cadmium.

3. The pixel cell of claim 2, wherein said transparent conductive material is selected from the group consisting of $SnO_2$, $In_2O_3$, $Cd_2SnO_4$, $ZnO$, $Zn_2SnO_4$, $ZnSnO_3$, $Cd_2SnO_4$, $(Zn_2SnO_4)^4$, $(MgIn_2O_4)^5$, $(CdSb_2O_6{:}Y)^6$, $(ZnSnO_3)^7$, $(GaInO_3)^8$, $(Zn_2In_2O_5)^9$, and $(InSn_3O_{12})^{10}$, and indium-tin oxide.

4. The pixel cell of claim 1, wherein said transparent conductive material is indium-tin-oxide.

5. The pixel cell of claim 1, wherein said transparent conductive material interconnect line has a cross-sectional shape that is hemi-elliptical.

6. The pixel cell of claim 1, wherein said transparent conductive material interconnect line has a top down shape that is selected from the group consisting of substantially circular, rectangular, and elliptical.

7. The pixel cell of claim 1, wherein said transparent conductive material interconnect line couples said charge storage region to external circuitry.

8. The pixel cell of claim 7, wherein said transparent conductive material interconnect line is connected to a gate associated with said charge storage region.

9. The pixel cell of claim 1, wherein said transparent conductive material interconnect line is coupled to a source/drain region of a transistor, wherein a transistor gate of said transistor is capable of resetting said associated charge storage region.

10. The pixel cell of claim 9, wherein said transparent conductive material interconnect line is capable of applying a voltage to said source/drain region of said transistor gate.

11. The pixel cell of claim 1, wherein said transparent conductive material interconnect line couples said charge storage region to a transistor gate.

12. The pixel cell of claim 1, wherein said transparent conductive material interconnect line is capable of applying a voltage to a transistor gate, said transistor gate gating the output of charge collected in said charge collection region.

13. A pixel cell comprising:
    a photosensor having a charge accumulation area;
    an associated charge storage region for storing charges accumulated by said photosensor;
    pixel circuitry coupled to said photosensor and charge storage region for operating said pixel cell to produce at least one pixel output signal; and
    a transparent conductive material interconnect line for focusing incident light onto said photosensor and providing an electrical connection to said circuitry.

14. An imager integrated circuit comprising:
    an array of pixel cells formed in a semiconductor substrate, wherein each pixel cell of said array comprises:
        a photosensor having at least one doped region,
        an associated charge collection region electrically coupled to said photosensor for collecting charge from said photosensor,
        a first transistor gate coupled to said charge collection region for converting said collected charges from said photosensor into pixel output signal, and
        a second transistor gate for outputting said pixel output signal to a first transparent conductive material interconnect line, said first transparent conductive material interconnect line being capable of focusing incident light onto said photosensor and conducting said pixel output signal to readout circuitry.

15. The integrated circuit of claim 14, fuirther comprising signal processing circuitry formed in said substrate and electrically connected to the array for receiving and processing pixel output signals representing an image acquired by the array and for providing output data representing said image.

16. The integrated circuit of claim 14, wherein said transparent conductive material is a semiconducting oxide of a material selected from the group consisting of tin, indium, zinc, and cadmium.

17. The integrated circuit of claim 14, wherein said transparent conductive material is selected from the group consisting of $SnO_2$, $In_2O_3$, $Cd_2SnO_4$, $ZnO$, $Zn_2SnO_4$, $ZnSnO_3$, $Cd_2SnO_4$, $(Zn_2SnO_4)^4$, $(MgIn_2O_4)^5$, $(CdSb_2O_6{:}Y)^6$, $(ZnSnO_3)^7$, $(GaInO_3)^8$, $(Zn_2In_2O_5)^9$, and $(In_4Sn_3O_{12})^{10}$, silicon nitride, and indium-tin oxide.

18. The integrated circuit of claim 14, wherein said transparent conductive material is indium-tin-oxide.

19. The integrated circuit of claim 14, further comprising a second transparent conductive material interconnect line coupled to a source/drain region of a third transistor gate, said third transistor gate being capable of resetting said associated charge collection region.

20. The integrated circuit of claim 19, wherein said second transparent conductive material interconnect line is capable of focusing incident light onto said photosensor.

21. The integrated circuit of claim 19, further comprising a row select line coupled to said second transistor gate, said row select line being capable of applying a voltage to said second transistor gate.

22. The integrated circuit of claim 21, wherein said row select line is formed of a transparent conductive material and is capable of focusing incident light on said photosensor.

* * * * *

UNITED STATES PATENT AND TRADEMARK OFFICE
CERTIFICATE OF CORRECTION

PATENT NO. : 7,355,222 B2 Page 1 of 1
APPLICATION NO. : 11/132179
DATED : April 8, 2008
INVENTOR(S) : Wells It is certified that error appears in the above-identified patent and that said Letters Patent is hereby corrected as shown below:

In column 9, line 40, in Claim 3, delete "$(InSn_3O_{12})^{10}$" and insert -- $(In_4Sn_3O_{12})^{10}$ --, therefor.

In column 10, line 32, in Claim 15, delete "fuirther" and insert -- further --, therefor.

Signed and Sealed this

First Day of July, 2008

JON W. DUDAS
*Director of the United States Patent and Trademark Office*